(12) United States Patent
Horita et al.

(10) Patent No.: US 10,689,573 B2
(45) Date of Patent: Jun. 23, 2020

(54) WET ETCHING COMPOSITION FOR SUBSTRATE HAVING SiN LAYER AND Si LAYER AND WET ETCHING METHOD USING SAME

(71) Applicant: MITSUBISHI GAS CHEMICAL COMPANY, INC., Chiyoda-ku (JP)

(72) Inventors: Akinobu Horita, Tokyo (JP); Kenji Shimada, Tokyo (JP); Kenichi Takahashi, Tokyo (JP); Toshiyuki Oie, Tokyo (JP); Aya Ito, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 16/068,811

(22) PCT Filed: Sep. 22, 2017

(86) PCT No.: PCT/JP2017/034250
§ 371 (c)(1),
(2) Date: Jul. 9, 2018

(87) PCT Pub. No.: WO2018/123166
PCT Pub. Date: Jul. 5, 2018

(65) Prior Publication Data
US 2019/0040317 A1  Feb. 7, 2019

(30) Foreign Application Priority Data

Dec. 26, 2016 (JP) .................. 2016-250545

(51) Int. Cl.
*C09K 13/08* (2006.01)
*H01L 21/306* (2006.01)
*H01L 21/3213* (2006.01)

(52) U.S. Cl.
CPC ........ *C09K 13/08* (2013.01); *H01L 21/30604* (2013.01); *H01L 21/32134* (2013.01)

(58) Field of Classification Search
CPC ... C09K 13/02; C09K 13/08; H01L 21/30604; H01L 21/32134
USPC ............................... 252/79.1, 79.3
See application file for complete search history.

(56) References Cited

U.S. PATENT DOCUMENTS

| | | | |
|---|---|---|---|
| 2,847,287 A | 8/1958 | Landgren | |
| 4,372,803 A | 2/1983 | Gigante | |
| 2006/0292821 A1 | 12/2006 | Young | |
| 2007/0082497 A1 | 4/2007 | Lee et al. | |
| 2008/0166832 A1* | 7/2008 | Young | H01L 21/0271 438/73 |
| 2009/0305931 A1 | 12/2009 | Lee et al. | |
| 2011/0028000 A1* | 2/2011 | Rogojina | H01L 21/30604 438/753 |
| 2012/0267627 A1* | 10/2012 | Barr | C09K 13/08 257/49 |
| 2015/0027978 A1 | 1/2015 | Barnes et al. | |
| 2016/0281038 A1* | 9/2016 | Tamai | C23G 1/061 |
| 2017/0062230 A1* | 3/2017 | Matsuo | H01L 21/67086 |
| 2017/0260449 A1 | 9/2017 | Barnes et al. | |

FOREIGN PATENT DOCUMENTS

| | | | | |
|---|---|---|---|---|
| JP | 10-56080 A | 2/1998 | | |
| JP | 11-67742 A | 3/1999 | | |
| JP | 2007-49145 A | 2/2007 | | |
| JP | 2014-45030 A | 3/2014 | | |
| WO | WO 00/72368 A1 | 11/2000 | | |
| WO | WO-0072368 A1 * | 11/2000 | | H01L 21/02019 |
| WO | WO-2015111684 A1 * | 7/2015 | | C23G 1/061 |

OTHER PUBLICATIONS

"Potassium fluoride" via https://www.encyclopedia.com/science/academic-and-educational-journals/potassiunn-fluoride ; pp. 1-3; 2006.*
Wikipedia "Ammonium Fluoride" via https://en.wikipedia.org/wiki/Ammoniunn_fluoride ; pp. 1-4; 2017.*
Extended European Search Report dated Oct. 11, 2018 in Patent Application No. 17887878.1, 9 pages.
Kolasinski, K., et al. "Stain etching of silicon with $V_2O_5$," Physica Status Solidi C: Current Topics in Solid State Physics, vol. 8, No. 6, XP055512117, 2011, pp. 1749-1753.
International Search Report dated Dec. 12. 2017, in PCT/JP2017/034250 filed Sep. 22, 2017.
Partial English Translation of Written Opinion of the International Searching Authority, in PCT/JP2017/034250 filed Sep. 22, 2017.
Walker, P. et al., "Handbook of Metal Etchants", 1991, ISBN: 0-8493-3623-6, 4 pages.
Ayat, M. et al., "Formation of nanostructured silicon surfaces by stain etching", Nanoscale Research Letters, vol. 9, No. 482, 2014, pp. 1-7.

* cited by examiner

*Primary Examiner* — Binh X Tran
(74) *Attorney, Agent, or Firm* — Oblon, McClelland, Maier & Neustadt, L.L.P.

(57) ABSTRACT

The present invention relates to a wet etching composition for a substrate having a SiN layer and a Si layer, comprising 0.1-50 mass % fluorine compound (A), 0.04-10 mass % oxidant (B) and water (D) and having pH in a range of 2.0-5.0. The present invention also relates to a wet etching process for a semiconductor substrate having a SiN layer and a Si layer, the process using the wet etching composition. The composition of the present invention can be used for a substrate having a SiN layer and a Si layer to enhance removal selectivity of Si over SiN while reducing corrosion of the device and the exhaust line and air pollution caused by a volatile component generated upon use and further a burden on the environment caused by the nitrogen content contained in the composition.

10 Claims, No Drawings

WET ETCHING COMPOSITION FOR SUBSTRATE HAVING SIN LAYER AND SI LAYER AND WET ETCHING METHOD USING SAME

TECHNICAL FIELD

The present invention relates to a composition that is capable of wet etching of silicon with selectivity over silicon nitride.

BACKGROUND ART

Various materials are used for semiconductor devices. For example, silicon nitride (hereinafter, referred to as SiN) films formed by various chemical vapor deposition techniques (hereinafter, CVD techniques) and silicon (hereinafter, referred to as Si) films formed by various CVD techniques are used. The process for producing a semiconductor element includes an etching step which includes a step of selectively removing a specific material over other material.

As one example, a Si film is often used as a hard mask in a semiconductor production process (Patent Literature 1). Since a hard mask is a material required in the step of making a semiconductor element but is unnecessary in the final semiconductor element, the hard mask needs to be removed after the processing involving the hard mask. Furthermore, since a SiN film may be present underneath as a material necessary for the final semiconductor, a process that selectively removes the Si film but not the SiN film may be required.

The removal methods generally include wet etching and dry etching. Since dry etching requires the steps of formation of a resist film, exposure, development, etching and removal of the resist, wet etching has higher production efficiency. Wet etching, however, requires higher removal selectivity with respect to the material.

As a wet etching composition for removing a Si film, an aqueous solution comprising hydrofluoric acid and concentrated nitric acid is known. In this case, concentrated nitric acid serves as an oxidant (Non-patent Literature 1). Concentrated nitric acid that serves as an oxidant, however, generates nitrogen dioxide. Since nitrogen dioxide with a boiling point of 21° C. is highly volatile and highly reactive, it has problems of causing corrosion of the structural members inside the device and the exhaust line and causing air pollution. Moreover, since nitric acid needs to be used at a high concentration to obtain a composition with the performance of interest, waste liquid containing a large amount of nitrogen has a problem of imposing a large burden on the environment.

As a process free of nitric acid, a technique that uses hydrofluoric acid and potassium permanganate is known (Patent Literature 2). While potassium permanganate is decomposed when heated to 200° C., potassium permanganate itself is not volatile. Since a volatile compound is not generated when potassium permanganate is used as an oxidant, it does not cause corrosion of the structural members inside the device and the exhaust line or does not cause air pollution. Moreover, since no nitrogen is contained, no burden is placed on the environment due to nitrogen. Although use of a mixture of hydrofluoric acid and potassium permanganate increases the etch rate of Si, it also increases the etch rate of SiN and thus selectivity required cannot be obtained.

Furthermore, although Si films are known to be removed with an alkaline aqueous solution (Non-patent Literature 1), the etch rate with an alkaline aqueous solution greatly differs depending on the crystal planes. Since crystal planes of a Si film formed by CVD method are facing various directions depending on places, there is a problem that etching hardly proceeds and thus the Si film cannot be removed at places where hardly etched planes are exposed.

CITATION LIST

Patent Literatures

Patent Literature 1: Japanese Unexamined Patent Application Publication No. Heisei 10-56080
Patent Literature 2: Japanese Unexamined Patent Application Publication No. Heisei 11-67742

Non-Patent Literature

Non-patent Literature 1: Perrin Walker and William H. Tarn "HANDBOOK OF METAL ETCHANTS", pages 996 and 1025

SUMMARY OF INVENTION

Technical Problem

A wet etching composition for a substrate having a SiN layer and a Si layer has been desired, which is capable of removing Si while maintaining the Si etch rate and which has high Si removal selectivity over SiN, without causing corrosion of the device and the exhaust line and air pollution due to a volatile component generated upon use and further without placing burden on the environment due to the nitrogen content contained in the composition.

Solutions to Problem

The present invention is as follows.
[1] A wet etching composition for a substrate having a SiN layer and a Si layer, comprising 0.1-50 mass % fluorine compound (A), 0.04-10 mass % oxidant (B) and water (D) and having pH in a range of 2.0-5.0, wherein the oxidant (B) comprises one or more selected from the group consisting of a permanganic acid compound and vanadium pentoxide and does not contain nitric acid.
[2] The wet etching composition according to [1], wherein the fluorine compound (A) comprises one or more selected from the group consisting of hydrogen fluoride, potassium fluoride, acidic potassium fluoride, ammonium fluoride and acidic ammonium fluoride.
[3] The wet etching composition according to either one of [1] and [2], further comprising a pH adjuster (C).
[4] The wet etching composition according to [3], wherein the pH adjuster (C) comprises one or more selected from the group consisting of potassium hydroxide, sodium hydroxide, ammonia, ethylenediamine, n-butylamine, 1-aminopropanol, pyridine, morpholine, polyallylamine, sulfuric acid, phosphoric acid and acetic acid.
[5] A wet etching process for a semiconductor substrate having a SiN layer and a Si layer, the process using the wet etching composition according to any one of [1] to [4].
[6] A process of producing a semiconductor element, comprising a step of selectively removing a Si layer by using the wet etching composition according to any one of [1] to [4] on a substrate having a SiN layer and the Si layer.

Advantageous Effects of Invention

The composition of the present invention can be used to perform wet etching on a substrate having a SiN layer and a Si layer with high etch rate of Si and high removal selectivity of Si over SiN while reducing corrosion of the device and the exhaust line and a burden on the environment due to the nitrogen content during the process of producing a semiconductor element.

DESCRIPTION OF EMBODIMENTS

The wet etching composition of the present invention comprises a fluorine compound (A), an oxidant (B), water (D) and optionally a pH adjuster (C), and is used for a substrate having a SiN layer and a Si layer.

The mechanism of removing Si is presumed to proceed through oxidization reaction of Si with the oxidant followed by reaction of dissolving the oxide with fluoride ion species.

Therefore, the concentration of the fluorine compound species and pH needs to be adjusted to retain fluoride ion species in the composition at high concentration, and an oxidant needs to be contained in the composition to allow the oxidization reaction to proceed.

Hereinafter, the fluorine compound (A), the oxidant (B), the pH adjuster (C) and water (D) will be described in detail.

Fluorine Compound (A)

According to the present invention, a fluorine compound (A) refers to any compound in which fluorine ions are released when dissolved in water.

Preferable examples of the fluorine compound (A) used with the present invention specifically include hydrogen fluoride, potassium fluoride, acidic potassium fluoride, ammonium fluoride and acidic ammonium fluoride. They are preferable in terms of high compatibility with water and high solubility in water. They are commercially available and two or more types of them may be used in combination.

The content of the fluorine compound (A) in the wet etching composition is 0.1-50 mass %, preferably 0.1-20 mass % and more preferably 0.5-12 mass %. Within this range, the rate of wet etching can be kept in a suitable range and etch rate selectivity for Si over SiN can be enhanced.

Oxidant (B)

According to the present invention, an oxidant (B) comprises any general oxidant but nitric acid.

Specific examples of the oxidant (B) used with the present invention include permanganic acid compounds (potassium permanganate, ammonium permanganate, sodium permanganate and silver permanganate) and vanadium pentoxide, among which potassium permanganate is preferable in terms of high solubility in water and stability. They are commercially available and two or more types of them may be used in combination.

The content of the oxidant (B) in the wet etching composition is 0.04-10 mass %, preferably 0.1-5 mass % and more preferably 0.1-4 mass %.

pH Adjuster (C)

According to the present invention, a pH adjuster (C) refers to a basic substance or an acidic substance that can be used for adjusting pH of the wet etching composition.

The pH of the wet etching composition of the present invention is in a range of 2.0-5.0 and preferably 2.5-4.5. Within this range, high etching performance can be maintained. Therefore, a pH adjuster (C) is suitably added according to the pH of the wet etching composition.

Specific examples of the basic substance include, but not particularly limited to, potassium hydroxide, sodium hydroxide, ammonia, ethylenediamine, n-butylamine, 1-amino-propanol, pyridine, morpholine and polyallylamine.

Specific examples of the acidic substance include, but not limited to sulfuric acid, acetic acid and phosphoric acid.

They are commercially available and two or more types of them may be used in combination.

Water (D)

Water (D) used with the present invention is preferably water that has been removed of metal ions, organic impurities, particles and the like by distillation, ion exchange treatment, filter treatment, any adsorption treatment or the like, and it is particularly preferably pure water or ultrapure water.

Other Components

The wet etching composition may be added with additives that are conventionally used in liquid compositions for semiconductors to an extent that does not impair the purpose of the present invention. For example, a chelating agent, a surfactant, an anti-foaming agent or the like can be added.

Method of Preparing Wet Etching Composition

A wet etching composition can be prepared by mixing a fluorine compound (A), an oxidant (B), water (D), optionally a pH adjuster (C) and the like and adjusting the pH to lie in a range of 2.0-5.0, preferably 2.5-4.5. The mixing method is not limited and any general mixing method can be employed.

Substrate Having SiN Layer and Si Layer

A substrate having a SiN layer and a Si layer according to the present invention refers to a substrate or the like that has a Si layer laminated on a SiN layer. Such substrate can be made, for example, by forming a SiN film on a Si substrate by Low Pressure CVD method, and further forming a Si film on the SiN film by CVD method.

Method of Using Wet Etching Composition

The wet etching composition of the present invention is used for wet etching of a substrate having a SiN layer and a Si layer, where the method for bringing the wet etching composition of the present invention into contact with the substrate is not particularly limited.

For example, a common wet etching method such as immersing a substrate into the wet etching composition of the present invention, or allowing the wet etching composition to make contact with a substrate by dropping or spraying.

The temperature of the wet etching composition of the present invention upon use is usually 20-80° C., preferably in a range of 25-70° C. and more preferably 30-60° C., which can appropriately be determined according to the substrate used.

The duration of bringing the substrate into contact with the wet etching composition of the present invention is, for example, in a range of 0.05-20 minutes and preferably 0.3-10 minutes, which can appropriately be determined according to the substrate used.

Thus, the wet etching composition of the present invention can be used for a substrate having a SiN layer and a Si layer so that the Si layer can selectively be removed to produce a semiconductor element desired.

EXAMPLES

Hereinafter, the present invention will be described specifically by way of examples, where the embodiments can appropriately be modified as long as the effect of the present invention can be achieved.

Substrates for Evaluations

As substrates used in Examples and Comparative examples, a Si film substrate obtained by forming a Si film to a thickness of 500 Å on a Si substrate by CVD method and a SiN film substrate obtained by forming a SiN film to a thickness of 500 Å on a Si substrate by Low Pressure CVD method were cut into 1 cm square chips, respectively.

Evaluation Method

<Film Thickness>

The thickness of the film on the chip was measured with an optical film thickness measuring instrument (from n&k Technology, n&k analyzer 1280).

<pH>

The pH of the composition was calculated from the acid-base concentration of the composition.

<Etch Rate>

The substrate (wafer) was immersed in the wet etching composition that was warmed to the temperature indicated in Tables 3 and 4, for 5 seconds for the Si film substrate and for 6 minutes for the SiN film substrate. Then, the wafer was taken out and immersed in 500 mL of water to remove the wet etching composition on the wafer. Subsequently, the water left on the surface was blown off with dry nitrogen gas.

The etch rate of the substrate material obtained with the wet etching composition was calculated based on the change in the film thickness before and after the immersion in the wet etching composition and the immersion time.

The etch rate of the Si film was evaluated as follows, where A and B were acceptable.

A: 1000 Å or more/min
B: 500 Å or more but less than 1000 Å/min
C: Less than 500 Å/min <Selectivity for Si Film/SiN Film>

The selectivity for Si film/SiN film was evaluated based on the value obtained by dividing the determined etch rate of the Si film by the determined etch rate of the SiN film, where A and B were acceptable.

A: 100 or higher
B: 50 or higher but lower than 100
C: Lower than 50

Examples 1-31

Wet etching compositions A-AD shown in Table 1 were prepared. The etch rates of the Si films and the SiN films were determined at the temperatures shown in Table 3.

The results are shown in Table 3. The etch rate evaluations of the Si films of Examples 1-31 were A or B while the selection ratios of the Si film/SiN film were also A or B.

Comparative Example 1

The etch rate of the Si film with the wet etching composition BA shown in Table 2 was determined at the temperature shown in Table 4. The results are shown in Table 4. The etch rate of the Si film was evaluated as C. An aqueous hydrogen fluoride solution was found incapable of etching the Si film.

Comparative Example 2

The etch rate of the Si film with the wet etching composition BB shown in Table 2 was determined at the temperature shown in Table 4. The etch rate of the Si film was insufficient. The results are shown in Table 4. The etch rate of the Si film was evaluated as C. A mixture of an aqueous hydrogen fluoride solution and an aqueous potassium hydroxide solution was found incapable of etching the Si film.

Comparative Example 3

The etch rate of the Si film with the wet etching composition BC shown in Table 2 was determined at the temperature shown in Table 4. The results are shown in Table 4. The etch rate of the Si film was evaluated as C. The aqueous potassium permanganate solution was found incapable of etching the Si film.

Comparative Example 4

The etch rate of the Si film with the wet etching composition BD shown in Table 2 was determined at the temperature shown in Table 4. The etch rate of the Si film was insufficient. The results are shown in Table 4. The etch rate of the Si film was evaluated as C. A mixture of an aqueous potassium hydroxide solution and an aqueous potassium permanganate solution was found incapable of etching the Si film.

Comparative Example 5

The etch rates of the Si film and the SiN film with the wet etching composition BE shown in Table 2 were determined at the temperature shown in Table 4. The results are shown in Table 4. The etch rate of the Si film was evaluated as C while the selection ratio of the Si film/SiN film was also evaluated as C. A too low potassium permanganate concentration was found to result low etch rate of the Si film and found to be incapable of obtaining the selection ratio of the Si film/SiN film.

Comparative Example 6

The wet etching composition BF shown in Table 2 was prepared but the solid component remained undissolved even when the wet etching composition was heated at 60° C. The wet etching composition BF had poor potassium permanganate solubility and found incapable to be prepared.

Comparative Example 7

The etch rates of the Si film and the SiN film with the wet etching composition BG shown in Table 2 were determined at the temperature shown in Table 4. The results are shown in Table 4. While the etch rate of the Si film was evaluated as B, the selection ratio of the Si film/SiN film was evaluated as C. The aqueous mixture solution of hydrogen fluoride and potassium permanganate was found to result good etch rate of the Si film by increasing the concentration of hydrogen fluoride but the selection ratio of the Si film/SiN film was low.

Comparative Example 8

The etch rates of the Si film and the SiN film with the wet etching composition BH shown in Table 2 were determined at the temperature shown in Table 4. The results are shown in Table 4. The etch rate of the Si film was evaluated as C while the selection ratio of the Si film/SiN film was also evaluated as C. The etch rate of the Si film was found to be decreased and the selection ratio of the Si film/SiN film was also low when the concentration of hydrogen fluoride in the aqueous mixture solution of hydrogen fluoride and potassium permanganate was decreased.

Comparative Example 9

The etch rate of the Si film with the wet etching composition BI shown in Table 2 was determined at the temperature shown in Table 4. The results are shown in Table 4. The etch rate of the Si film was evaluated as C. Higher pH was found to prevent etching of the Si film.

Comparative Example 10

The etch rates of the Si film and the SiN film with the wet etching composition BJ shown in Table 2 were determined at the temperature shown in Table 4. The results are shown in Table 4. The etch rate of the Si film was evaluated as C while the selection ratio of the Si film/SiN film was also evaluated as C. Hydrogen peroxide was found unsuitable as an oxidant.

Comparative Example 11

The etch rates of the Si film and the SiN film with the wet etching composition BK shown in Table 2 were determined at the temperature shown in Table 4. The results are shown in Table 4. While the etch rate of the Si film was evaluated as B, the selection ratio of the Si film/SiN film was evaluated as C. Ammonium persulfate was found unsuitable as an oxidant.

TABLE 1

Compositions of Examples

| Wet etching composition | Fluorine compound (A) Type | Concentration Mass % | Oxidant (B) Type | Concentration Mass % | pH adjuster (C) Type | Concentration Mass % | Water (D) Concentration Mass % |
|---|---|---|---|---|---|---|---|
| A | Hydrogen fluoride | 1.5 | Potassium permanganate | 0.1 | Potassium hydroxide | 2.1 | 96.3 |
| B | Hydrogen fluoride | 1.5 | Potassium permanganate | 0.3 | Potassium hydroxide | 2.1 | 96.1 |
| C | Hydrogen fluoride | 2.2 | Potassium permanganate | 0.3 | Potassium hydroxide | 3 | 94.5 |
| D | Hydrogen fluoride | 5.1 | Potassium permanganate | 0.1 | Potassium hydroxide | 7 | 87.8 |
| E | Hydrogen fluoride | 10 | Potassium permanganate | 0.3 | Potassium hydroxide | 14 | 75.7 |
| F | Hydrogen fluoride | 2.5 | Potassium permanganate | 0.5 | Potassium hydroxide | 3 | 94 |
| G | Hydrogen fluoride | 2.5 | Potassium permanganate | 0.5 | Potassium hydroxide | 5 | 92 |
| H | Hydrogen fluoride | 2.5 | Potassium permanganate | 0.5 | Potassium hydroxide | 6 | 91 |
| I | Hydrogen fluoride | 3.5 | Potassium permanganate | 0.3 | Ammonia | 2 | 96.2 |
| J | Hydrogen fluoride | 2.2 | Potassium permanganate | 0.3 | Ammonia | 0.9 | 97.6 |
| K | Hydrogen fluoride | 2.8 | Potassium permanganate | 0.3 | Potassium hydroxide | 1.2 | 95.7 |
| L | Hydrogen fluoride | 0.8 | Potassium permanganate | 3.5 | Potassium hydroxide | 1.1 | 94.7 |
| M | Hydrogen fluoride | 1 | Potassium permanganate | 2.5 | Potassium hydroxide | 1.2 | 95.3 |
| N | Hydrogen fluoride | 2.5 | Potassium permanganate | 0.5 | Sodium hydroxide | 2 | 95 |
| O | Acidic potassium fluoride | 4.2 | Potassium permanganate | 0.3 | — | 0 | 95.5 |
| P | Hydrogen fluoride / Potassium fluoride | 1.1 / 3.1 | Potassium permanganate | 0.3 | — | 0 | 95.5 |
| Q | Acidic ammonium fluoride | 5 | Potassium permanganate | 0.3 | Ammonia | 0.5 | 94.2 |
| R | Hydrogen fluoride / Ammonium fluoride | 1.2 / 4.3 | Potassium permanganate | 0.3 | — | 0 | 94.2 |
| S | Ammonium fluoride | 5.2 | Potassium permanganate | 0.3 | Sulfuric acid | 2 | 92.5 |
| T | Potassium fluoride | 5 | Potassium permanganate | 0.5 | Sulfuric acid | 2 | 92.5 |
| U | Potassium fluoride | 5 | Potassium permanganate | 0.3 | Phosphoric acid | 2 | 92.7 |
| V | Potassium fluoride | 5 | Potassium permanganate | 0.3 | Acetic acid | 5 | 89.7 |
| W | Hydrogen fluoride | 2.5 | Potassium permanganate | 0.5 | Ethylenediamine | 2 | 94.9 |
| X | Hydrogen fluoride | 2.5 | Potassium permanganate | 0.5 | n-Butylamine | 4.5 | 93 |
| Y | Hydrogen fluoride | 2.5 | Potassium permanganate | 0.5 | 1-Amino-2-propanol | 4 | 93 |
| Z | Hydrogen fluoride | 3 | Potassium permanganate | 0.5 | Pyridine | 3 | 94.9 |
| AA | Hydrogen fluoride | 2.5 | Potassium permanganate | 0.5 | Morpholine | 5.8 | 91.2 |
| AB | Hydrogen fluoride | 2.5 | Potassium permanganate | 0.5 | PAA-05 | 0.8 | 93.2 |
| AC | Hydrogen fluoride | 2.7 | Vanadium pentoxide | 1 | Potassium hydroxide | 2.5 | 93.8 |
| AD | Hydrogen fluoride | 5 | Vanadium pentoxide | 2 | Potassium hydroxide | 5 | 89 |

PAA-05: Polyallylamine (Primary amine, average molecular weight 5000, from Nittobo Medical)

TABLE 2

Compositions of Comparative examples

| Wet etching composition | Fluorine compound (A) Type | Concentration Mass % | Oxidant (B) Type | Concentration Mass % | pH adjuster (C) Type | Concentration Mass % | Water (D) Concentration Mass % |
|---|---|---|---|---|---|---|---|
| BA | Hydrogen fluoride | 1.5 | — | 0 | — | 0 | 96.4 |
| BB | Hydrogen fluoride | 1.5 | — | 0 | Potassium hydroxide | 2.1 | 96.4 |
| BC | — | 0 | Potassium permanganate | 0.3 | — | 0 | 99.7 |
| BD | — | 0 | Potassium permanganate | 0.3 | Potassium hydroxide | 2.1 | 97.6 |
| BE | Hydrogen fluoride | 1.5 | Potassium permanganate | 0.03 | Potassium hydroxide | 2.1 | 96.4 |
| BF | Hydrogen fluoride | 1 | Potassium permanganate | 5 | Potassium hydroxide | 1.4 | 92.6 |

TABLE 2-continued

Compositions of Comparative examples

| Wet etching composition | Fluorine compound (A) | | Oxidant (B) | | pH adjuster (C) | | Water (D) |
|---|---|---|---|---|---|---|---|
| | Type | Concentration Mass % | Type | Concentration Mass % | Type | Concentration Mass % | Concentration Mass % |
| BG | Hydrogen fluoride | 5 | Potassium permanganate | 0.5 | — | 0 | 94.5 |
| BH | Hydrogen fluoride | 0.05 | Potassium permanganate | 0.5 | — | 0 | 98 |
| BI | Hydrogen fluoride | 2.5 | Potassium permanganate | 0.5 | Potassium hydroxide | 7 | 94 |
| BJ | Hydrogen fluoride | 2.2 | Hydrogen peroxide | 20 | Potassium hydroxide | 3 | 74.8 |
| BK | Hydrogen fluoride | 6.8 | Ammonium persulfate | 30 | Potassium hydroxide | 3.9 | 59.3 |

TABLE 3

Experimental results of Examples

| Example | Wet etching composition | (A) Concentration Mass % | (B) Concentration Mass % | pH | Treatment temperature °C. | Etch rate (Å/min) Si film | Etch rate (Å/min) SiN film | Evaluation | Si film/SiN film Selection ratio | Evaluation |
|---|---|---|---|---|---|---|---|---|---|---|
| 1 | A | 1.5 | 0.1 | 3.5 | 35 | 837 | 11 | B | 76 | B |
| 2 | B | 1.5 | 0.3 | 3.5 | 35 | 1240 | 12 | A | 103 | A |
| 3 | B | 1.5 | 0.3 | 3.5 | 50 | 1760 | 30 | A | 59 | B |
| 4 | C | 2.2 | 0.3 | 3.5 | 35 | 1900 | 17 | A | 112 | A |
| 5 | D | 5.1 | 0.1 | 3.5 | 35 | 1488 | 27 | A | 55 | B |
| 6 | E | 10 | 0.3 | 3.5 | 35 | 6052 | 47 | A | 129 | A |
| 7 | F | 2.5 | 0.5 | 3.4 | 35 | 2495 | 20 | A | 125 | A |
| 8 | G | 2.5 | 0.5 | 3.9 | 35 | 1667 | 7 | A | 238 | A |
| 9 | H | 2.5 | 0.5 | 4.2 | 35 | 858 | 6 | B | 143 | A |
| 10 | I | 3.5 | 0.3 | 3.8 | 35 | 1909 | 14 | A | 136 | A |
| 11 | J | 2.2 | 0.3 | 3.4 | 35 | 1079 | 14 | A | 77 | B |
| 12 | K | 2.8 | 0.3 | 2.8 | 35 | 1437 | 18 | A | 80 | B |
| 13 | L | 0.8 | 3.5 | 3.5 | 35 | 1315 | 23 | A | 57 | B |
| 14 | M | 1 | 2.5 | 3.4 | 45 | 1459 | 22 | A | 66 | B |
| 15 | N | 2.5 | 0.5 | 3.3 | 35 | 962 | 17 | B | 57 | B |
| 16 | O | 4.2 | 0.3 | 3.5 | 35 | 1900 | 17 | A | 112 | A |
| 17 | P | 4.2 | 0.3 | 3.5 | 35 | 1950 | 16 | A | 122 | A |
| 18 | Q | 5 | 0.3 | 3.5 | 35 | 1770 | 16 | A | 111 | A |
| 19 | R | 5.5 | 0.3 | 3.8 | 35 | 1810 | 15 | A | 121 | A |
| 20 | S | 5.2 | 0.3 | 3.8 | 35 | 1909 | 14 | A | 136 | A |
| 21 | T | 5 | 0.5 | 3.6 | 35 | 1824 | 13 | A | 140 | A |
| 22 | U | 5 | 0.3 | 3.2 | 35 | 1022 | 7 | A | 80 | B |
| 23 | V | 5 | 0.3 | 3.7 | 35 | 848 | 7 | B | 121 | A |
| 24 | W | 2.5 | 0.5 | 3.5 | 35 | 2238 | 17 | A | 132 | A |
| 25 | X | 2.5 | 0.5 | 3.5 | 35 | 774 | 11 | B | 70 | B |
| 26 | Y | 2.5 | 0.5 | 3.3 | 35 | 811 | 16 | B | 51 | B |
| 27 | Z | 3 | 0.5 | 3.1 | 35 | 1060 | 21 | A | 51 | B |
| 28 | AA | 2.5 | 0.5 | 3.5 | 35 | 830 | 16 | B | 52 | B |
| 29 | AB | 2.5 | 0.5 | 2.6 | 35 | 724 | 9 | B | 80 | B |
| 30 | AC | 2.7 | 1 | 3.2 | 35 | 790 | 15 | B | 53 | B |
| 31 | AD | 5 | 2 | 3.2 | 35 | 1713 | 24 | A | 71 | B |

TABLE 4

Experimental results of Comparative examples

| Comparative example | Wet etching composition | (A) Concentration Mass % | (B) Concentration Mass % | pH | Treatment temperature °C. | Etch rate (Å/min) Si film | Etch rate (Å/min) SiN film | Evaluation | Si film/SiN film Selection ratio | Evaluation |
|---|---|---|---|---|---|---|---|---|---|---|
| 1 | BA | 1.5 | 0 | — | 35 | <10 | — | C | — | — |
| 2 | BB | 1.5 | 0 | 2.2 | 35 | <10 | — | C | — | — |
| 3 | BC | 0 | 0.3 | 3.5 | 35 | <10 | — | C | — | — |
| 4 | BD | 0 | 0.3 | — | 35 | <10 | — | C | — | — |
| 5 | BE | 1.5 | 0.03 | — | 35 | 342 | 10 | C | 34 | C |

TABLE 4-continued

Experimental results of Comparative examples

| Comparative example | Wet etching composition | (A) Concentration Mass % | (B) Concentration Mass % | pH | Treatment temperature ° C. | Etch rate (Å/min) Si film | Etch rate (Å/min) SiN film | Evaluation | Si film/SiN film Selection ratio | Evaluation |
|---|---|---|---|---|---|---|---|---|---|---|
| 7 | BG | 5 | 0.5 | 1.9 | 35 | 899 | 37 | B | 24 | C |
| 8 | BH | 0.05 | 0.5 | 3.1 | 35 | 16 | 1 | C | 17 | C |
| 9 | BI | 2.5 | 0.5 | 6.2 | 35 | <10 | — | C | — | — |
| 10 | BJ | 2.2 | 20 | 3.5 | 35 | <10 | 37 | C | <1 | C |
| 11 | BK | 6.8 | 30 | 2.9 | 35 | 547 | 84 | B | 7 | C |

—: Undetermined or unevaluated

The invention claimed is:

1. A wet etching composition, comprising:
greater than 1 mass % to less than 10 mass % of fluorine compound (A),
0.04-10 mass % oxidant (B),
a pH adjuster (C), wherein the pH adjuster (C) comprises one or more selected from the group consisting of potassium hydroxide, sodium hydroxide, ammonia, ethylenediamine, n-butylamine, 1-amino-propanol, pyridine, morpholine, polyallylamine, sulfuric acid, phosphoric acid, and acetic acid, and
water (D),
wherein the composition has pH in a range of 2.0 to 4.5, and the oxidant (B) contains one or more selected from the group consisting of a permanganic acid compound and vanadium pentoxide and does not contain nitric acid.

2. The wet etching composition according to claim 1, wherein the fluorine compound (A) comprises one or more selected from the group consisting of hydrogen fluoride, potassium fluoride, potassium bifluoride, ammonium fluoride, and ammonium bifluoride.

3. The wet etching composition according to claim 1, wherein a pH of the composition is from 2.5 to 4.5.

4. The wet etching composition according to claim 1, consisting essentially of: the fluorine compound (A), the oxidant (B), the pH adjuster (C), water (D), and optionally a chelating agent, surfactant, and anti-foaming agent.

5. The wet etching composition according to claim 1, comprising:
greater than 1 mass % to less than 10 mass % of fluorine compound (A), wherein the fluorine compound (A) comprises one or more selected from the group consisting of hydrogen fluoride, potassium fluoride, potassium bifluoride, ammonium fluoride, and ammonium bifluoride; and
1 0.1-5 mass % oxidant (B).

6. The wet etching composition according to claim 1, comprising:
1.5 to less than 10 mass % of fluorine compound (A), wherein the fluorine compound (A) comprises one or more selected from the group consisting of hydrogen fluoride, potassium fluoride, potassium bifluoride, ammonium fluoride, and ammonium bifluoride; and
1 0.1-3.5 mass % oxidant (B).

7. A wet etching process for a semiconductor substrate having a SiN layer and a Si layer, the process comprising:
etching the semiconductor substrate by using the wet etching composition according to claim 1.

8. A process of producing a semiconductor element, the process comprising:
selectively removing a Si layer by using the wet etching composition according to claim 1 on a substrate having a SiN layer and the Si layer.

9. A wet etching composition comprising:
greater than 1 mass % to less than or equal to 50 mass % of fluorine compound (A),
0.04-10 mass % oxidant (B),
a pH adjuster (C), wherein the pH adjuster (C) comprises one or more selected from the group consisting of potassium hydroxide, sodium hydroxide, ethylenediamine, n-butylamine, pyridine, morpholine, polyallylamine, and acetic acid, and
water (D),
wherein the composition has pH in a range of 2-4.5, and the oxidant (B) contains one or more selected from the group consisting of a permanganic acid compound and vanadium pentoxide and does not contain nitric acid.

10. The wet etching composition according to claim 9, wherein the pH adjuster (C) comprises one or more selected from the group consisting of potassium hydroxide and sodium hydroxide.

* * * * *